United States Patent
Lee et al.

(10) Patent No.: US 8,627,266 B2
(45) Date of Patent: Jan. 7, 2014

(54) TEST MAP CLASSIFICATION METHOD AND FABRICATION PROCESS CONDITION SETTING METHOD USING THE SAME

(75) Inventors: Sunjae Lee, Yongin-si (KR); Jungyoon Hwang, Yongin-si (KR); Junghee Kim, Soengnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/564,827

(22) Filed: Aug. 2, 2012

(65) Prior Publication Data

US 2013/0045545 A1 Feb. 21, 2013

(30) Foreign Application Priority Data

Aug. 16, 2011 (KR) .................. 10-2011-0081361

(51) Int. Cl.
*G06F 17/50* (2006.01)
(52) U.S. Cl.
USPC .............................................. 716/137
(58) Field of Classification Search
USPC .............................................. 716/136
See application file for complete search history.

(56) References Cited

U.S. PATENT DOCUMENTS

| | | | |
|---|---|---|---|
| 5,787,190 A * | 7/1998 | Peng et al. ................ | 382/145 |
| 6,622,135 B1 * | 9/2003 | Imbert De Tremiolles et al. ................ | 706/20 |
| 7,405,088 B2 | 7/2008 | Matsushita et al. | |
| 7,415,386 B2 * | 8/2008 | Burch et al. ................ | 702/183 |
| 7,514,949 B2 * | 4/2009 | Kang et al. ................ | 324/762.05 |
| 7,720,275 B2 | 5/2010 | Shibuya et al. | |
| 7,912,276 B2 | 3/2011 | Shibuya et al. | |
| 8,009,895 B2 | 8/2011 | Lee et al. | |
| 2007/0211932 A1 | 9/2007 | Lee et al. | |
| 2010/0195896 A1 | 8/2010 | Shibuya et al. | |
| 2011/0164809 A1 | 7/2011 | Shibuya et al. | |

FOREIGN PATENT DOCUMENTS

| | | |
|---|---|---|
| JP | 2006-266872 A | 10/2006 |
| KR | 10-2005-0030346 A | 3/2005 |
| KR | 10-0567896 B1 | 4/2006 |
| KR | 10-2007-0070903 A | 7/2007 |
| KR | 10-2007-0077329 A | 7/2007 |
| KR | 10-2009-0070235 A | 7/2009 |

OTHER PUBLICATIONS

Wang, "Separation of composite defect patterns on wafer bin map using support vector clustering", Expert System with Applications, 2009, pp. 2554-2561, vol. 36.

Hsu and Chien, "Hybrid data mining approach for pattern extraction from wafer bin map to improve yield in semiconductor manufacturing", Int. J. Production Economics, 2007, pp. 88-103, vol. 107.

(Continued)

*Primary Examiner* — Jack Chiang
*Assistant Examiner* — Brandon Bowers
(74) *Attorney, Agent, or Firm* — Sughrue Mion, PLLC

(57) ABSTRACT

A test map classification method includes modifying test data by converting to a test map including a wafer identifier, a coordinate, and data on whether a predetermined failure item occurs; calculating similarities of wafer pairs in the test map; performing similarity filtering to reset all the similarities, except for at least one similarity, on the basis of a predetermined wafer; determining whether there are similar wafers by comparing the filtered similarities with a reference value; and classifying spatial patterns using a similar relationship between the wafer pairs when there are similar wafers.

12 Claims, 13 Drawing Sheets

(56) References Cited

OTHER PUBLICATIONS

Li and Huang, "Defect spatial pattern recognition using a hybrid SOM-SVM approach in semiconductor manufacturing", Expert Systems with Applications, 2009, pp. 374-385, vol. 36.

Palma et al., "Unsupervised spatial pattern classification of electrical-wafer-sorting maps in semiconductor manufacturing", 2005, pp. 1857-1865, vol. 26.

* cited by examiner

Fig. 6
Before Similarity Filtering
| | A | B | C | D |
|---|---|---|---|---|
| A | - | 1 | 2 | 3 |
| B | 1 | - | 4 | 5 |
| C | 2 | 4 | - | 6 |
| D | 3 | 5 | 6 | - |
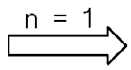
n = 1
After Similarity Filtering
| | A | B | C | D |
|---|---|---|---|---|
| A | - | - | - | 3 |
| B | - | - | - | 5 |
| C | - | - | - | 6 |
| D | - | - | 6 | - |
Fig. 7
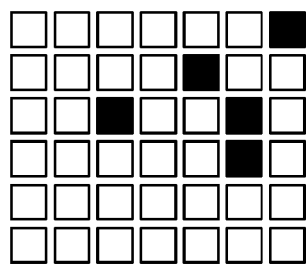
A Test Map
A Failure Rate = 11.90%
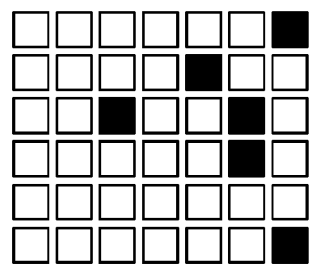
B Test Map
B Failure Rate = 14.29%
Failure Rate Average (A~B) = 13.10%
Failure Rate Difference (A~B) = 2.39%

After Similarity Filtering

| | A | B | C | D |
|---|---|---|---|---|
| A | | - | - | 3 |
| B | - | | - | 5 |
| C | - | - | | 6 |
| D | - | - | 6 | |

Similarity Determining

If Reference Value = 4
B ~ D
C ~ D

Spatial Pattern

B ~ C ~ D

| PAIR | SIMILAR | DIFFERENT |
|---|---|---|
| A, B | O | |
| B, C | O | |
| A, D | | O |
| D, E | O | |
| F, G | | O |
| ⋮ | ⋮ | ⋮ |

| SPATIAL PATTERN GROUP |
|---|
| A, B, C |
| D, E |
| ⋮ |

TEST MAP CLASSIFICATION METHOD AND FABRICATION PROCESS CONDITION SETTING METHOD USING THE SAME

CROSS-REFERENCE TO RELATED APPLICATIONS

This US non-provisional patent application claims priority under 35 USC §119 to Korean Patent Application No. 10-2011-0081361, filed on Aug. 16, 2011, the entirety of which is hereby incorporated by reference.

BACKGROUND

Embodiments relate to test map classification methods and fabrication process condition setting methods using the same.

With advancements in semiconductor technologies, technology for device design, technology for a unit process, and technology for process management are becoming more important. In particular, error minimization through innovation in process technology is essential to improving semiconductor manufacturing yield. Accordingly, there is a requirement for a series of steps of detecting defects occurring at various positions of a wafer during development of optimized process technology and a manufacturing process and analyzing the detected defects to be used as data for optimized process setting of a manufacturing apparatus.

In general, a semiconductor manufacturing process includes a pre-process, a post-process, and a test process. The pre-process is also referred to as a fabrication process in which integrated circuit patterns are formed on a semiconductor wafer made of single-crystalline silicon. The post-process is also referred to as an assembly process in which an integrated circuit package is formed by separating individual chips from the semiconductor wafer, connecting conductive leads or balls to the chips to be electrically connected to an external device, and molding the chips with a resin such as an epoxy resin to be protected from an external environment.

The test process is performed to test whether the integrated circuit package is normally operable and sort the chips into non-defective chips and defective chips. Before the assembly process is performed, an electrical die sorting (EDS) process is performed to inspect electrical characteristics of the respective chips constituting the semiconductor wafer. In the EDS process, after repairable chips and non-repairable chips are identified among the respective chips, the repairable chips are repaired while the non-repairable chips are eliminated. Therefore, the EDS process serves to reduce time and costs required for the assembly process and the test process.

When the fabrication process (pre-process) is completed, defect analysis processes are performed by a predetermined inspection apparatus to detect defects on the entire surface of the semiconductor wafer and sort the detected defects.

SUMMARY

Embodiments may provide a test map classification method and a fabrication process condition setting method using the test map classification method.

According to an aspect of an exemplary embodiment, the test map classification method may include modifying test data by converting the test data to a test map including a wafer identifier, a coordinate, and data on whether a predetermined failure item occurs; calculating similarities of wafer pairs in the test map; performing similarity filtering to reset all the similarities, except for at least one similarity, on the basis of a predetermined wafer; determining whether there are similar wafers by comparing the filtered similarities with a reference value; and classifying spatial patterns using a similar relationship between the wafer pairs when there are similar wafers.

In an exemplary embodiment, calculating similarities of wafer pairs may include calculating the similarities using similarity indexes corresponding to predetermined coordinates of the wafer pairs. The similarity indexes may be values that depend on whether chips corresponding to the predetermined coordinates are failed or good.

In an exemplary embodiment, the predetermined coordinates may be all coordinates.

In an exemplary embodiment, the predetermined coordinates may be some coordinates.

In an exemplary embodiment, the test map may include a first wafer test map and a second wafer test map, classified by the wafer identifier. The similarity indexes may include a first similarity index that indicates when both chips corresponding to any one coordinate in the first and second wafer test maps are good; a second similarity index that indicates when one chip corresponding to any one coordinate in the first and second wafer test maps is good and the other chip is failed; and a third similarity index that indicates when both chips corresponding to any one coordinate in the first and second wafer test maps are failed.

In an exemplary embodiment, the third similarity index may be greater than the first similarity index, and the first similarity index may be greater than the second similarity index.

In an exemplary embodiment, each of the similarity indexes may be the sum of similarity indexes of a corresponding wafer pair.

In an exemplary embodiment, each of the similarity indexes may be an average of similarity indexes of a corresponding wafer pair.

In an exemplary embodiment, performing similarity filtering may further include selecting a similarity of a wafer pair according to a predetermined criterion when at least one wafer pair, of all wafer pairs, having the same similarity is selected.

In an exemplary embodiment, the reference value may be dependent on averages of the wafer pairs when determining whether there are similar wafers.

In an exemplary embodiment, the reference value may be dependent on a difference between failure rates of the wafer pairs.

In an exemplary embodiment, determining whether there are similar wafers may further include determining that there is a reference surface formed by the reference value, a relationship with averages of the failure rates, and a relationship with the differences between the failure rates, and that a pair of wafers existing within or above the reference surface are similar to each other.

According to another aspect of an exemplary embodiment, the fabrication process condition setting method may include testing wafers fabricated under at least one process condition; classifying wafer test maps of the test wafers using a similarity; and setting the at least one process condition using the classified wafer test maps. The similarity may be calculated using similarity indexes that depend on whether chips corresponding to predetermined coordinates of a wafer pair are each failed or good.

In an exemplary embodiment, classifying wafer test maps may include calculating similarities of all wafer pairs in the wafers; performing similarity filtering to reset all the calculated similarities, except for at least one similarity, on the basis of a predetermined wafer; determining whether there are similar wafers by comparing the filtered similarities with a reference value; and classifying spatial patterns using a similar relationship of a pair of wafers when the pair of wafers are similar to each other.

In an exemplary embodiment, classifying wafer test maps may include calculating similarities of all the wafer pairs in the wafers; determining whether there are similar wafer by comparing the calculated similarities with a reference value; and classifying spatial patterns using a similar relationship of a pair of wafers when the pair of wafers are similar to each other.

According to a further aspect of an exemplary embodiment, a fabrication process condition setting method may include testing a plurality of wafers fabricated under at least one process condition; deriving a test map corresponding to data on whether there is a predetermined failure for classification; classifying wafer test maps using similarities of wafer pairs from the deriving test map; and setting the at least one process condition based on the classified wafer test maps.

BRIEF DESCRIPTION OF THE DRAWINGS

Embodiments will become more apparent in view of the attached drawings and accompanying detailed description. The embodiments depicted therein are provided by way of example, not by way of limitation. Like reference numerals refer to the same or similar elements. The drawings are not necessarily to scale, and emphasis is being placed upon illustrating aspects of the embodiments.

FIG. 6 illustrates similarity filtering according to an embodiment.

FIG. 7 illustrates a wafer A test map and a wafer B test map.

DETAILED DESCRIPTION

Embodiments will now be described more fully hereinafter with reference to the accompanying drawings, in which preferred embodiments are shown. However, embodiments may be embodied in many different forms and should not be construed as limited to the embodiments set forth herein. Rather, these embodiments are provided so that this disclosure will be thorough and complete, and will fully convey the scope of the embodiments to those skilled in the art. Like numbers refer to like elements throughout.

Figure 1:
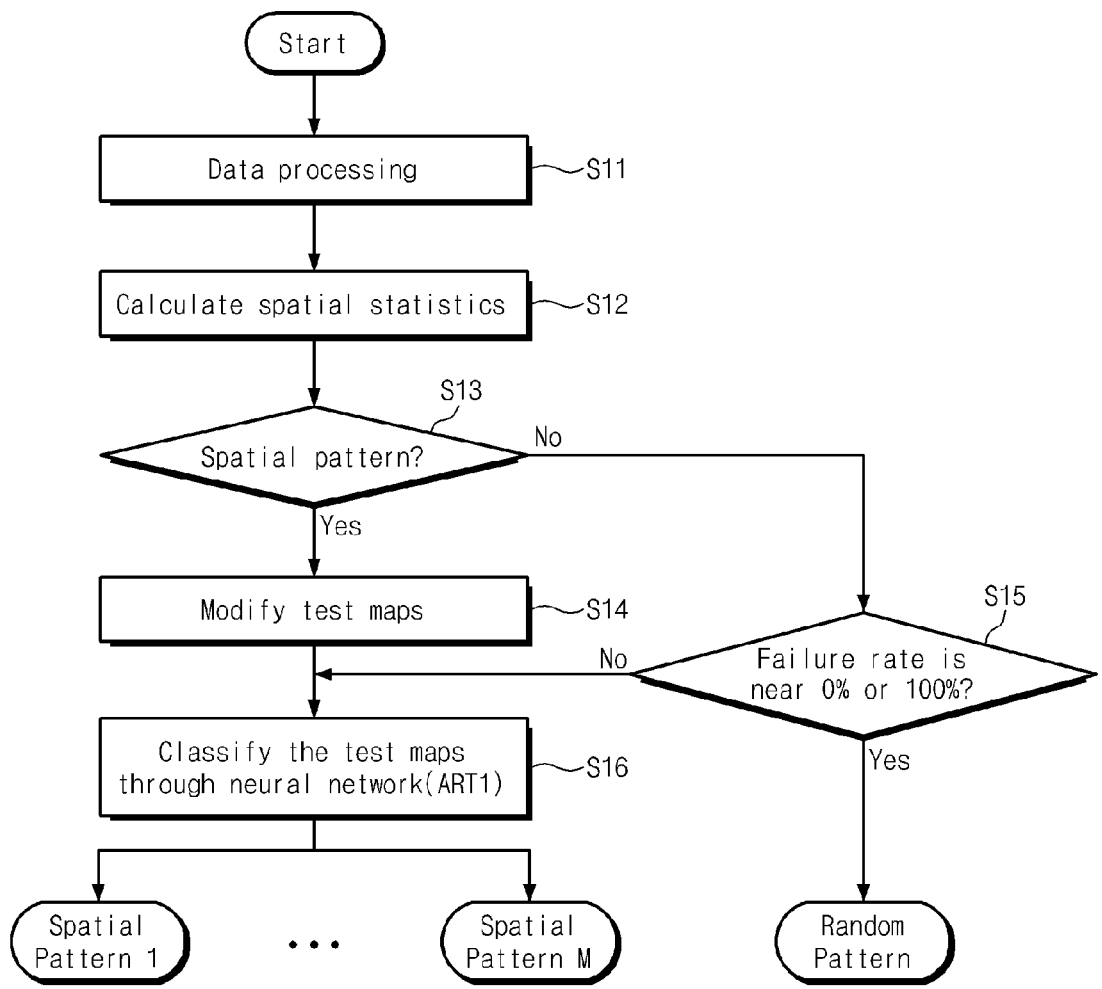
FIG. 1 illustrates a test map classification method through a related art ART neural network.

FIG. 1 illustrates a test map classification method through a related art adaptive resonance theory (hereinafter referred to as "ART") neural network. The test map classification through the related art ART neural network will now be described below in detail with reference to FIG. 1.

Test data comprising wafer identifier, coordinate, and failure item is converted to a test map comprising wafer identifier, coordinate, and data on whether a predetermined failure item desired to be classified is generated (S11). Spatial statistics are calculated for a combination of its own test result on the basis of a predetermined coordinate and test results of coordinates adjacent in eight directions, i.e., horizontally, vertically, and diagonally (S12). A spatial pattern is determined according to a value obtained by calculating the spatial statics (S13). For example, when a log value of the value obtained by calculating the spatial statics is greater than a predetermined value, the test data is determined to be a spatial pattern.

When the test data is determined to be the spatial pattern, a test map is modified to perform more precise classification in the neural network (S14). For example, when a specific test result value of the predetermined coordinate is good and specific test result values of the coordinates in the eight directions are all failed, the specific test result value of the predetermined coordinate is modified from "good" to "failed".

Meanwhile, when the test data is not determined to be the spatial pattern, it is determined whether a failure rate of the test map is near 0 percent or 100 percent (S15). If the failure rate of the test map is not near 0 percent or 100 percent, the flow proceeds to S16.

Figure 2:
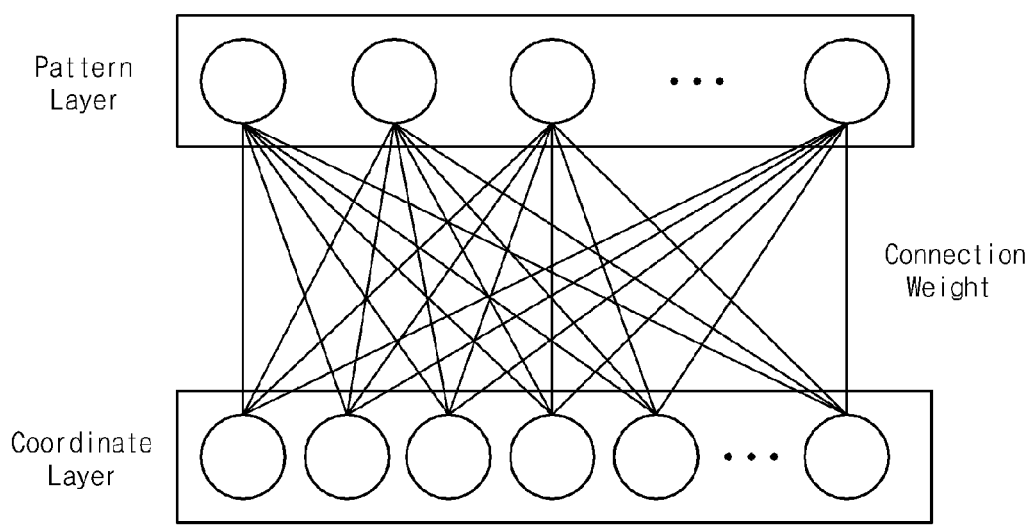
FIG. 2 illustrates an ART neural network learning operation.

Thereafter, a learning operation of the ART neural network is performed to classify the test map (S16). For example, the learning operation of the ART neural network is now described. The ART neural network includes two layers. As shown in FIG. 2, one layer includes nodes of the same number as coordinates, and the other layer include nodes of the same number as patterns to be classified. Each of the nodes in the two layers of the ART neural network has a connection relationship to all nodes in all layers in which they are not included. Weights based on the connection relationships are given to the nodes in the two layers of the ART neural network, respectively.

The learning process of the ART neural network is performed as follows. Data on whether there is a failure on each coordinate is input to one layer, whereas data corresponding to any one of a plurality of patterns to be classified is input to the other layer. Therefore, the existing weights concerned with all the connection relationships are adjusted according to these input data. As a result, the learning operation is performed while test map data to previously know classification results of the patterns are all input. After the test map data are all input, the weights concerned with the connection relationships are not changed any longer. And then, a node of a pattern layer having a maximum value is selected using the unchanged weights to classify the test map.

Figure 3:
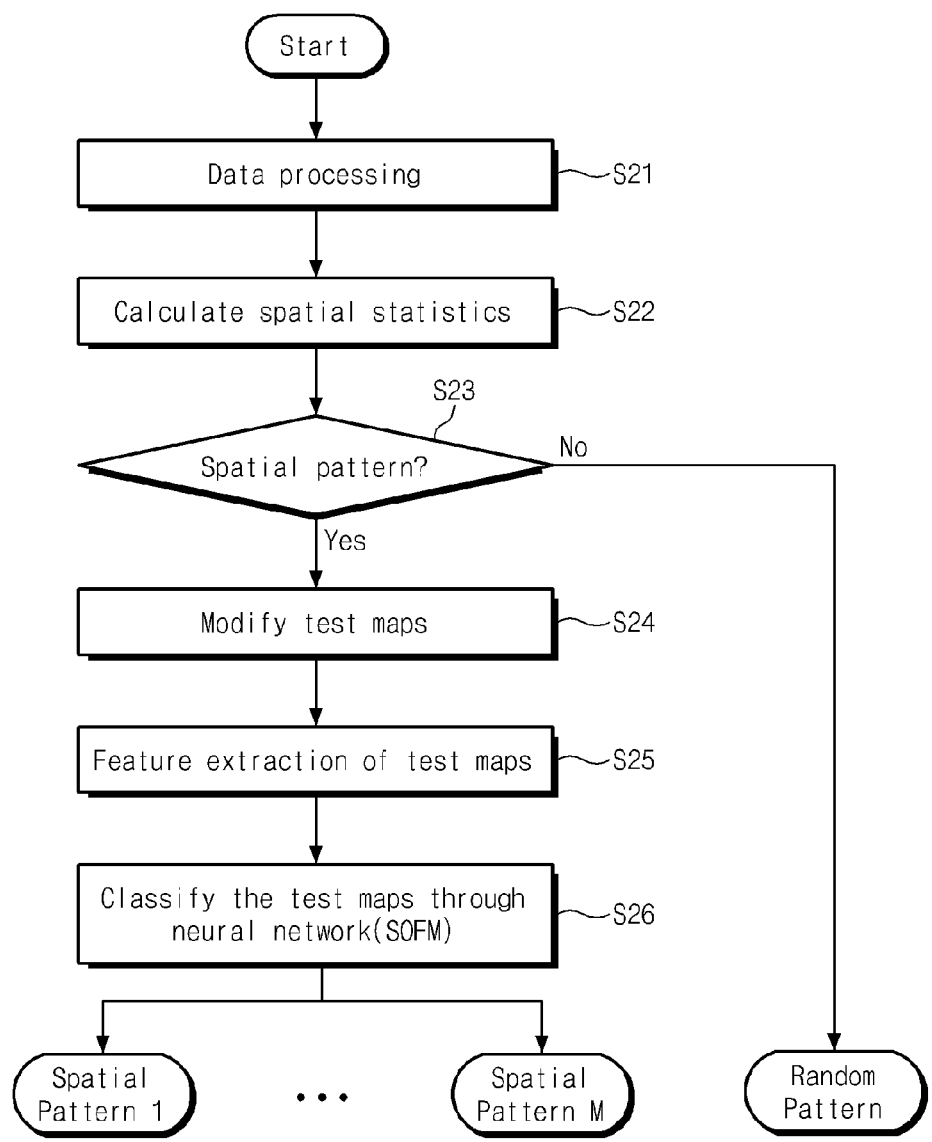
FIG. 3 illustrates a test map classification method through a related art SOFM neural network.

FIG. 3 exemplary illustrates a test map classification method through a self-organization feature map (hereinafter referred to as "SOFM") neural network. The test map classification method through the SOFM neural network will now be described below in detail with reference to FIG. 3.

A data pre-processing operation (S21), a calculation operation of spatial statics (S22), a determination operation of the spatial statics (S23), and a modification operation of a test map (S24) are identical to those described in FIG. 1, respectively.

A result value of a test map on each coordinate is not directly input to the SOFM neural network and a specific value of the test map is input to the SOFM neural network. The specific value of the test map may be one of various values such as energy, entropy, and the center of gravity. For achieving this, the specific value of the test map is extracted (S25). Thereafter, the SOFM neural network performs a classification operation of the test map using the input specific value of the test map (S26).

The test map classification method through adaptive resonance theory (ART) suffers from disadvantages that a classification result relatively varies with a test data set used to learn a neural network and, when a pattern that is not learned in advance is input, the input pattern is not classified as a new pattern. Moreover, the test map classification method through the ART also suffers from difficulty in defining the sufficient amount of learning for obtaining an accurate result.

Unlike the test map classification method through the ART neural network, the test map classification method through the SOFM neural network does not need a learning operation but must indicate how many patterns are classified from test patterns. Moreover, although the test map classification method through the SOFM neural network must determine the number of two-dimensional neural network nodes, a criterion for determining the number is not clear. Accordingly, since the number of the two-dimensional neural network nodes has a great effect on the classification result, the degree of classification result variation with the determination of the number of nodes becomes greater.

Embodiments provide a test map classification method for classifying a test map based on an absolute criterion without having a relative effect on a classification result according to the number of patterns for use in a neural network, the number of nodes or a test map data set for use in learning.

Figure 4:
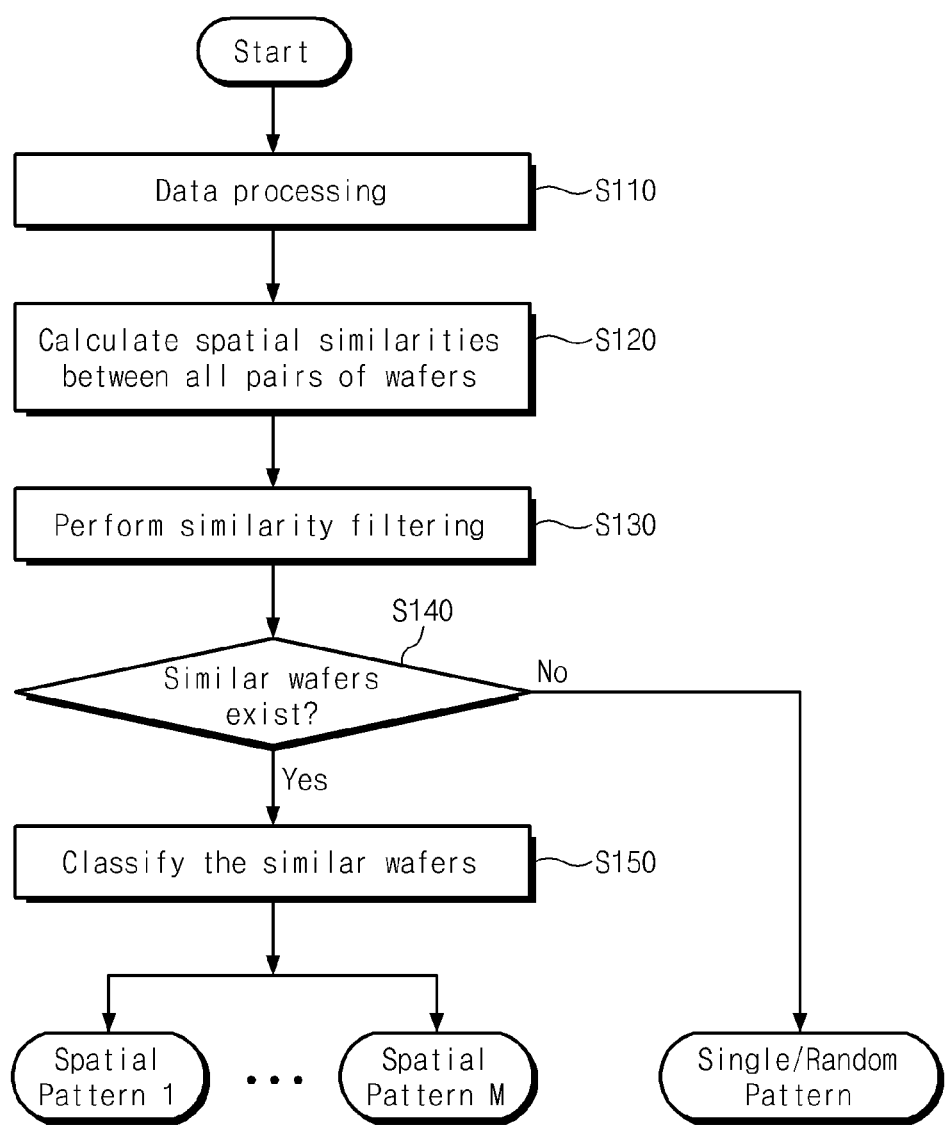
FIG. 4 illustrates a test map classification method according to an embodiment.

FIG. 4 illustrates a test map classification method according to an embodiment. The test map classification method will now be described below in detail with reference to FIG. 4.

The test map classification method starts with testing a plurality of wafers. Each of the wafers may be at least one product manufactured under a predetermined process condition. A test result may be output as test data including identifier, coordinate, and failure items of the wafers. The coordinate may correspond to a plurality of chips formed in a wafer.

In a data pre-processing operation, the test data is converted to a test map including wafer identifier, coordinate, and data on whether failure items are generated (S110). The test map may include a plurality of wafer test maps separated according to the wafer identifier. Each of the wafer test maps includes data on whether the coordinate and the failure items are generated.

Next, spatial similarities of all wafer pairs (i.e., all pairs of wafers) are calculated (S120). The spatial similarities are calculated using similar indexes (or similar weights) indicated depending on whether chips, respectively corresponding to predetermined coordinates of the wafer pair, are good or failed.

The similar indexes may have different values depending on whether chips corresponding to the same coordinate of a wafer pair are good or failed. For example, when the chips corresponding to the same coordinate of a wafer pair are all failed, the similar index may be relatively high. Meanwhile, when the chips corresponding to the same coordinate of a wafer pair are all good, the similar index may be relatively low.

In an exemplary embodiment, the similar index may be experimentally determined. The similar index is an absolute value that is independent of the kind of wafers or the number of wafers.

In an exemplary embodiment, a similarity of wafer pair may be calculated by the sum of similarity indexes of predetermined coordinates. The predetermined coordinates may be all coordinates or some coordinates.

In another exemplary embodiment, a similarity of wafer pair may be calculated by the average of similar indexes of predetermined coordinates.

After the similarity calculation is terminated, similarity filtering is performed (S130). In the step of performing the similarity filtering, except for at least one similarity, the other similarities are reset on the basis of a predetermined wafer. This is aimed at, except for the predetermined number of wafer pair (e.g., one wafer pair) having a high similarity to any one wafer, making the other wafer pairs negligible. The similarity filtering may prevent wafers having different failure patterns from being classified as wafer having the same failure pattern associated with wafers having various failure patterns.

Next, similarities of the filtered wafer pairs are compared with a reference value to determine whether there are similar wafers (S140). If the similarity of a wafer pair is lower than the reference value, the wafer pair may be determined to have a single/random pattern. Meanwhile, if the similarity of the wafer pair is higher than the reference value, it may be determined that there are similar wafers. In other words, the wafer pair may have a similar spatial pattern.

After determining whether there are similar wafers among all wafer pairs, a spatial pattern (or regular pattern) of a test map is classified using a similar relationship (i.e., intersection relationship) of wafer pairs having a similar spatial pattern (S150). The similar relationship may be determined depending on whether wafer pairs having a similar spatial pattern are similar to each other. For example, when there are similar wafers in both a first wafer pair and a second wafer pair and both the first and second wafer pairs include the same wafer, the first wafer pair and the second water pair may be classified to have the same spatial pattern.

A related art test map classification method (e.g., ART or SOFM) has difficulty in performing an accurate classification operation because a classification result relatively varies with test data or the number of parameters.

On other hand, the test map classification method according to an embodiment is allowed to perform an accurate classification operation because a similarity of a wafer pair is determined using a similarity index that is independent of the kind of wafers or the number of wafers.

Figure 5:
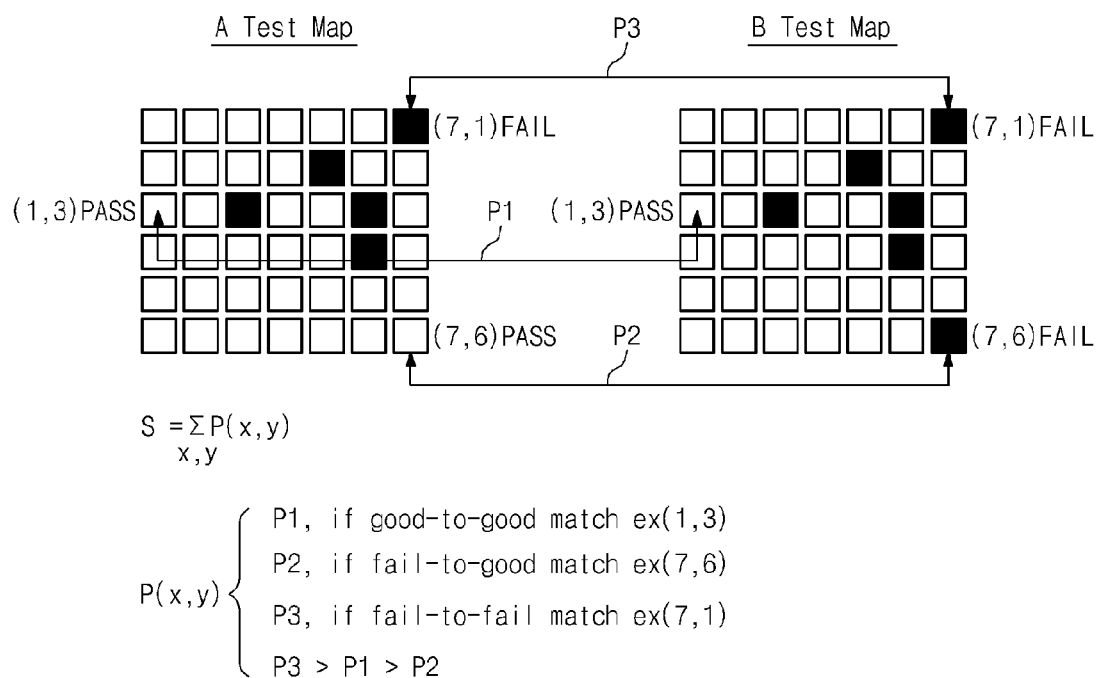
FIG. 5 illustrates a calculation of similarity of a pair of wafers according to an embodiment.

FIG. 5 illustrates a calculation of similarity of a pair of wafers according to an embodiment. Referring to FIG. 5, a similarity S of a wafer pair comprising a wafer A test map and a wafer B test map is expressed by an equation 1 below.

$$S = \sum_{x,y} P(x, y) \qquad \text{[Equation 1]}$$

Referring to the equation 1, the similarity S is the sum of all coordinates in a wafer pair. In the equation 1, P(x,y) is a similarity index of the coordinate (x,y).

As shown in FIG. 5, P(x,y) is one of P1, P2, and P3. P1 represents a similarity index in case of good-to-good match (e.g., coordinate (1,3)), P2 represents a similarity index in case of failed-to-good match (or good-to-failed match) (e.g., coordinate (7,6)), and P3 represents a similarity index in case of failed-to-failed match (e.g., coordinate (7,1)).

The above-mentioned similarity S is a value used to determine whether there is a similarity of "failed". In this case, P3 may be greater than P2 and P1 may be greater than P2(P3>P1>P2).

On the other hand, if the similarity S is a value used to determine whether there is a similarity of "good". In this case, P2 may be set to be greater than P2 and P1 may be set to be greater than P3(P2>P1>P3).

In an exemplary embodiment, the similarity indexes P1, P2, and P3 may be determined by a test. The similarity indexes P1, P2, and P3 may be absolute values that do not vary with the kind of wafers and may be applied to a plurality of wafers.

In FIG. 5, a similarity S of a wafer pair is calculated by the sum of similarity indexes of all coordinates in the wafer pair. However, embodiments may not be limited thereto. In another exemplary embodiment, a similarity S of a wafer pair may be calculated by the sum of similarity indexes of some coordinates in the wafer pair. In yet another exemplary embodiment, a similarity S of a wafer pair may be calculated by an average of similarity indexes of all coordinates in the wafer pair. In another exemplary embodiment, the similarity S of the wafer pair may be calculated by an average of similarity indexes of some coordinates in the wafer pair.

A similarity S of a wafer pair according to an embodiment is calculated using similarity indexes of predetermined (all or some) coordinates.

FIG. 6 illustrates similarity filtering according to an embodiment. For the brevity of description, it is assumed that four wafers are provided and, except for a similarity of a wafer fair having the highest similarity (n=1, n being the number which is a reference of similarity filtering), the other similarities are reset during the similarity filtering. The number of wafers or the number, which is a reference of similarity filtering, may not be limited.

Prior to the similarity filtering, a similarity of a wafer pair (wafers A and B) is 1, a similarity of a wafer pair (wafers A and C) is 2, and a similarity of a wafer pair (wafers A and D) is 3. In other words, the similarity of the wafer pair (wafers A and D) is highest. If the similarity filtering is performed, the other similarities are reset except for the similarity of the wafer pair (wafers A and D). As shown in FIG. 6, if similarity filter is performed in the same manner as described above, the similarities of the wafer pair (wafers A and D), the wafer pair (wafers B and D), and the wafer pair (wafers C and D) are left.

In an exemplary embodiment, when only predetermined number of wafer pairs are selected among wafer pairs having the same similarity in the step of performing the similarity filtering, predetermined number of similarities may be left according to the a predetermined criterion. On the other hand, when only predetermined number of wafer pairs are selected among wafer pairs having the same similarity in the step of performing the similarity filtering, predetermined number of similarities may be left by means of other various manners.

In the step of performing the similarity filtering according to an embodiment, at least one similarity is left and the other similarities are reset among all the wafer pairs.

FIGS. 7 to 10 illustrate the step of determining similar wafers according to an embodiment.

FIG. 7 exemplary illustrates a wafer A test map and a wafer B test map. In the wafer A test map, among 42 (7×6) chips, five chips are test-failed in predetermined items. In the wafer B test map, six chips are test-failed in predetermined items. Thus, a failure rate of the wafer A test map is 11.9 percent and a failure rate of the wafer B test map is 14.28 percent. A failure rate average of the wafer pair (wafers A and B) is 13.10 percent, and a failure rate difference of the wafer pair (wafers A and B) is 2.23 percent.

A reference value for determining similar wafers according to an embodiment may vary with a failure rate average or failure rate difference of a wafer pair.

Figure 8:
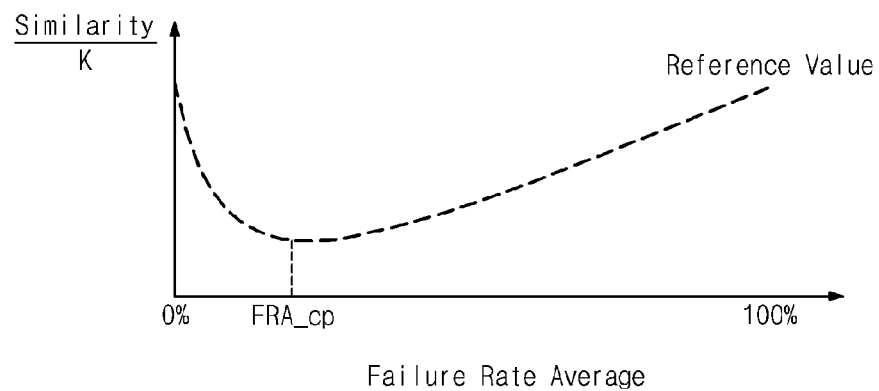
FIG. 8 conceptually illustrates a relationship between a reference value and a failure rate average of a pair of wafers according to an embodiment.

FIG. 8 conceptually illustrates a relationship between a reference value and a failure rate average of a pair of wafers according to an embodiment. In the graph of FIG. 8, a horizontal axis represents a failure rate average of a wafer pair and a vertical axis represents a unit similarity. The unit similarity is a value obtained by dividing a similarity of a wafer pair by the number K of sampled coordinates (K being a positive integer greater than two). As shown in the graph of FIG. 8, from 0 percent to a critical point FRA_cp, a reference value used to determine whether a pair of wafers are similar to each other decreases as the failure rate average increases. From the critical point FRA_cp to 100 percent, the reference value increases as the failure rate average increases.

A reference value used to determine whether a pair of wafers according to an embodiment is dependent on a failure rate average.

Figure 9:
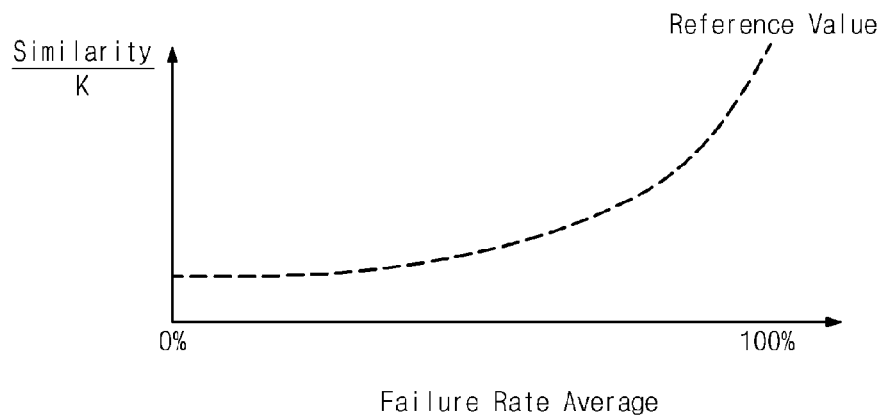
FIG. 9 conceptually illustrates a relationship between a reference value and a failure rate difference of a pair of wafers according to an embodiment.

FIG. 9 conceptually illustrates a relationship between a reference value and a failure rate difference of a pair of wafers according to an embodiment. In the graph of FIG. 9, a horizontal axis represents a failure rate difference of a wafer pair and a vertical axis represents a unit similarity. As shown in the graph of FIG. 9, a reference value used to determine a pair of wafers are similar to each other increases as a failure rate difference increases.

A reference value used to determine whether a pair of wafers according to an embodiment is dependent on a failure rate difference.

Figure 10:
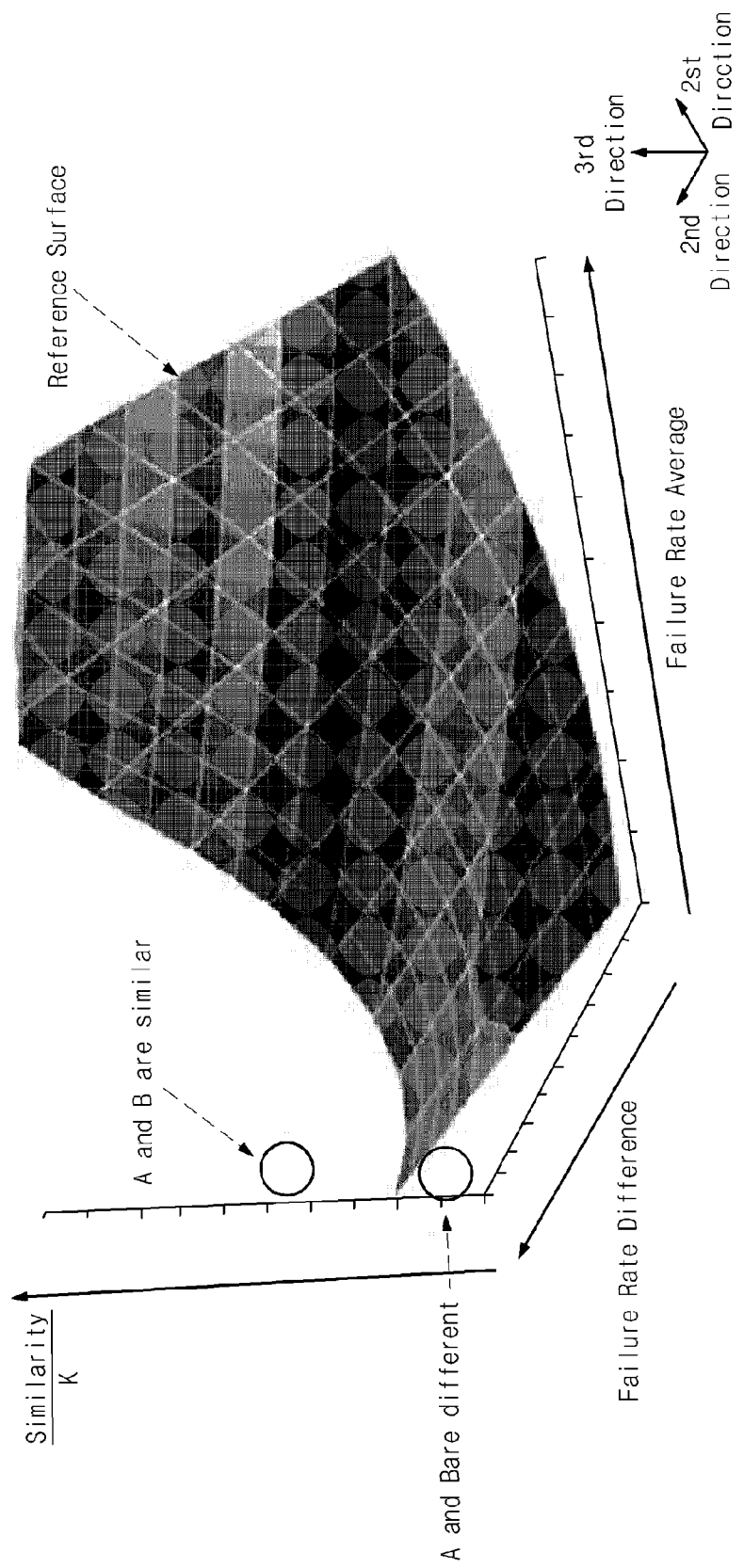
FIG. 10 three-dimensionally illustrates a relationship between a reference value determining whether a pair of wafers are similar and failure rate average and difference of the pair of wafers according to an embodiment.

FIG. 10 three-dimensionally illustrates a relationship between a reference value determining whether a pair of wafers are similar and failure rate average and difference of the pair of wafers according to an embodiment. Referring to FIG. 10, a reference surface is formed by reference values that are used to determine whether a pair of wafers are similar to each other and correspond to a failure rate average and a failure rate difference. When a similarity of a wafer pair is located below the reference surface, it is determined that a wafer pair (wafers A and B) have different patterns (random pattern or single pattern). In other words, the wafers A and B are different from each other. When the similarity is located above the reference surface, it is determined that the wafer pair (wafers A and B) have similar spatial patterns. In other words, the wafers A and B are similar to each other.

In the step of determining whether a pair of wafers are similar to each other, a similarity is determined depending on whether the similarity is located below or under a reference surface. The reference surface is dependent on a failure rate average or a failure rate difference of the wafer pair.

Figures 11, 12:
FIG. 11 illustrates a classification of a spatial pattern according to an embodiment.
FIG. 12 illustrates another classification of a spatial pattern according to an embodiment.

FIG. 11 illustrates classification of a spatial pattern according to an embodiment.

For the brevity of description, it is assumed that a reference value used to determine whether wafer pairs are similar to each other is four. Referring to FIG. 11, following the similarity filtering, wafer pairs having a similarity greater than four are a pair of wafers B and D and a pair of wafers C and D. Accordingly, after the similar determination operation is performed, the pair of wafers B and D and the pair of wafers C and D may be determined to be similar wafers.

Thereafter, the wafers B, C, and D may be classified to have the same spatial pattern through a similar relationship (or intersection relationship) of the similar wafers.

In the step of classifying a spatial pattern according to an embodiment, the spatial pattern is classified using a similar relationship of similar wafers.

FIG. 12 illustrates another classification of a spatial pattern according to an embodiment. If a similar determination operation of a wafer pair is performed, each of the wafer pairs may be determined to be "similar" or "different". Referring to FIG. 12, according to the similar relationship of the wafer pairs, wafers A, B, and C are classified into one spatial pattern group and wafers D and E are classified into another spatial pattern group. The similar relationship of the wafer pairs may be determined depending on whether the wafer pairs are similar to each other.

In the step of classifying a spatial pattern according to an embodiment, spatial pattern groups are classified according to a similar relationship depending on whether a pair of wafers are similar to each other.

Figure 13:
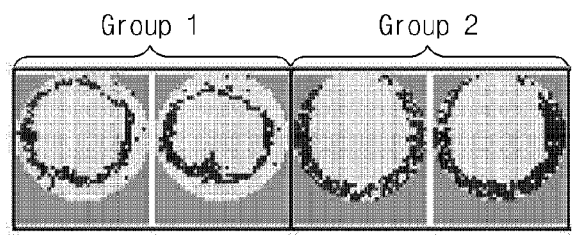
FIG. 13 illustrates a test map classification result based on similarity of a pair of wafers using similarity indexes when the number of chips in a wafer is a first value.
Figure 14:
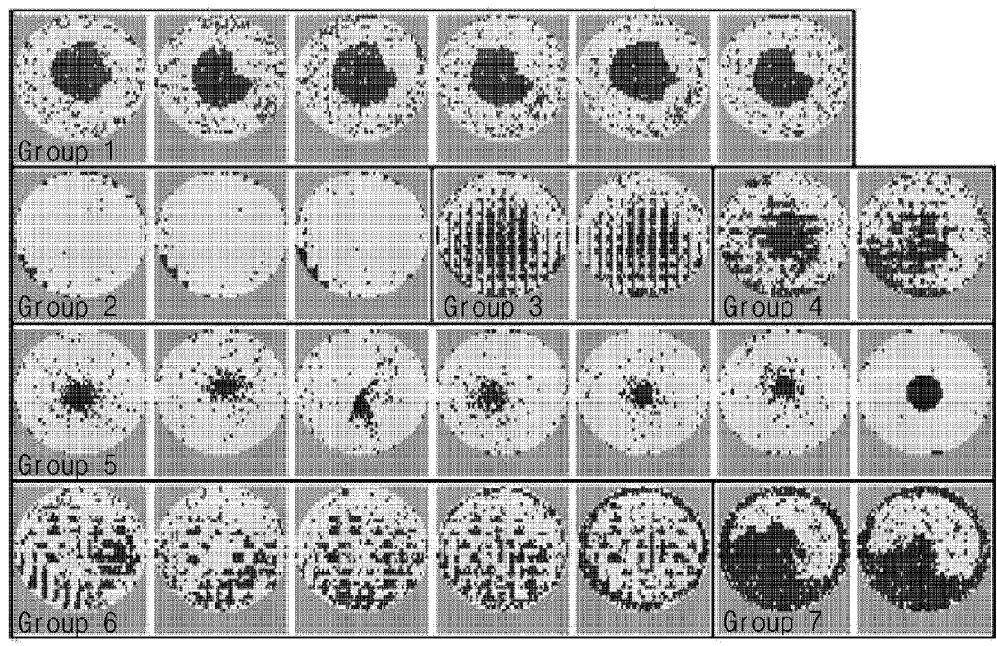
FIG. 14 illustrates a test map classification result based on similarity of a pair of wafers using similarity indexes when the number of chips in a wafer is a second value.
Figure 15:
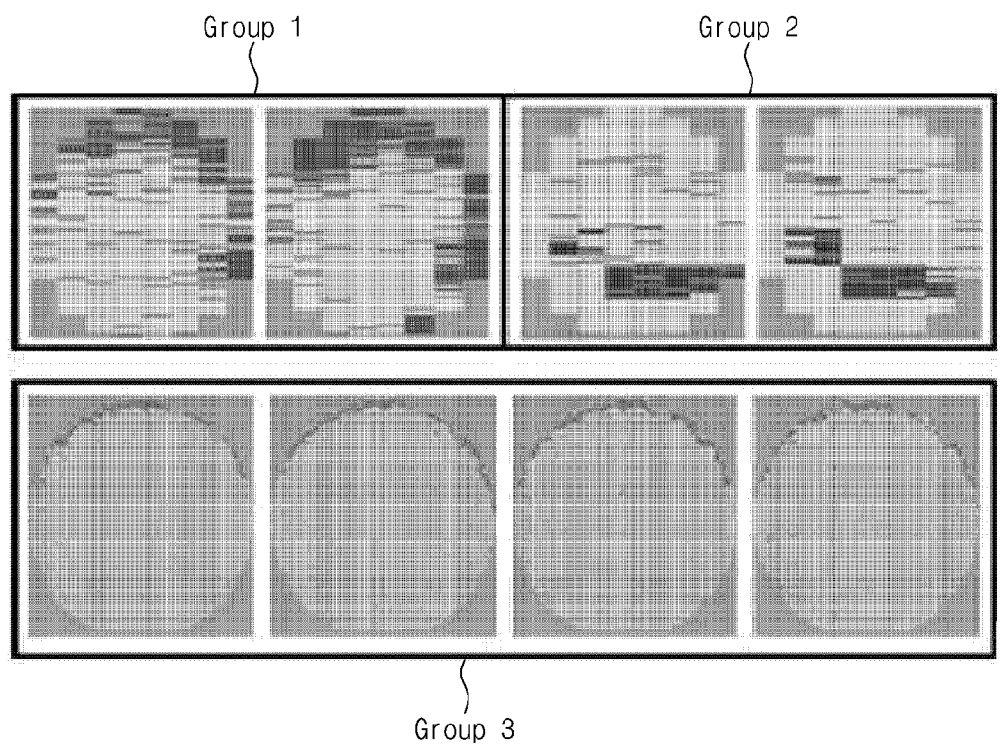
FIG. 15 illustrates a test map classification result based on similarity of a pair of wafers when wafer chips are larger in size and smaller in number than the wafer chips shown in FIGS. 13 and 14.

FIGS. 13 to 15 illustrate test map classification results according to an embodiment.

FIG. 13 illustrates a test map classification result based on similarity of a pair of wafers using similarity indexes when the number of chips in a wafer is a first value. Referring to FIG. 13, the number of spatial pattern groups is two.

FIG. 14 illustrates a test map classification result based on similarity of a pair of wafers using similarity indexes when the number of chips in a wafer is a second value. The second value is greater than the first value. Referring to FIG. 14, the number of spatial pattern groups is seven.

FIG. 15 illustrates a test map classification result based on similarity of a pair of wafers when wafer chips are larger in size and smaller in number than the wafer chips shown in FIGS. 13 and 14. Referring to FIG. 15, the number of spatial pattern groups is three.

Referring to FIGS. 13 to 15, the test map classification method according to an embodiment is allowed to efficiently classify spatial pattern groups irrespective of the size of a wafer or the number of chips in the wafer.

The test map classification method described in FIG. 4 includes calculating similarities of wafer pairs and performing similarity filtering. However, the test map classification method according to embodiments need not include performing similarity filtering.

Figure 16:
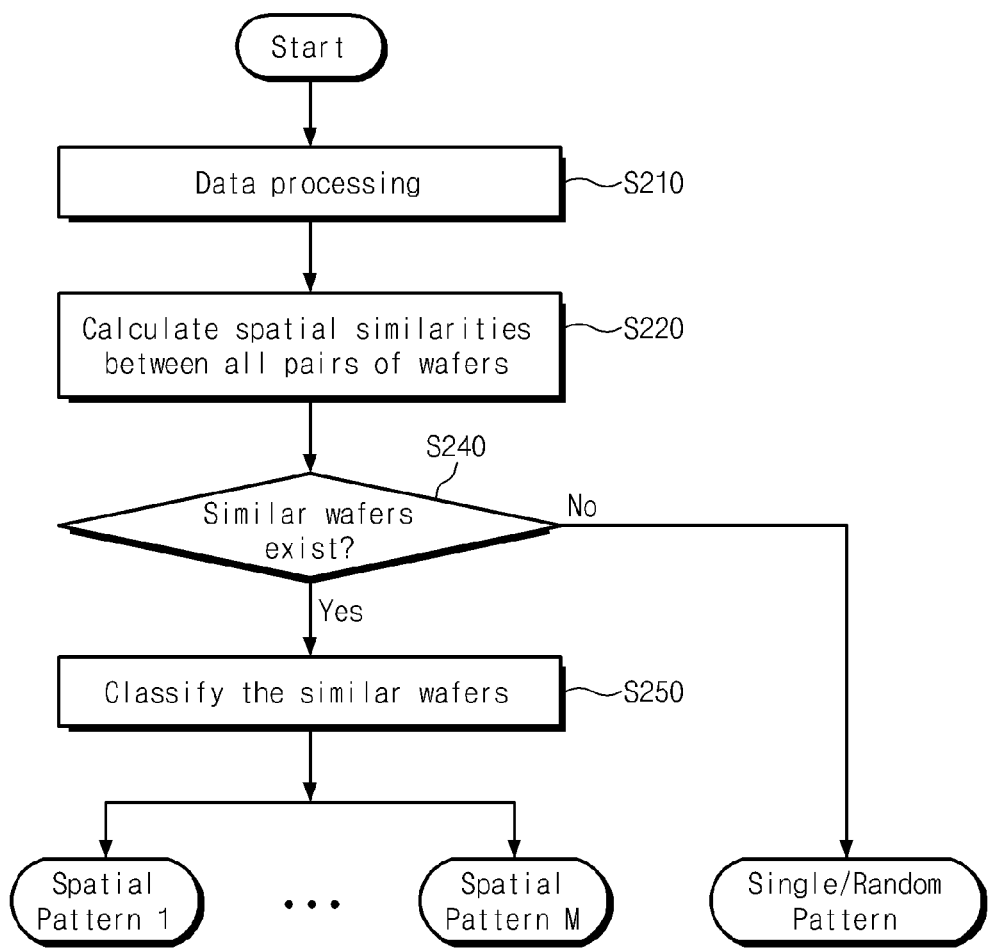
FIG. 16 is a flowchart illustrating a test map classification method according to another embodiment.

FIG. 16 is a flowchart illustrating a test map classification method according to another embodiment. The test map classification method described in FIG. 16 does not include performing similarity filtering (S130 in FIG. 4) of the test map classification method described in FIG. 4. In the test map classification method described in FIG. 16, it is determined whether there are similar wafers (S240) using similarities (S220) calculated from a test map in which data pre-processing is performed (210) and spatial pattern groups are classified when there are similar wafers (S250).

According to the test map classification methods of embodiments, spatial pattern groups are classified using a similarity of a wafer pair. Embodiments may be applied to a fabrication process condition setting method.

Figure 17:
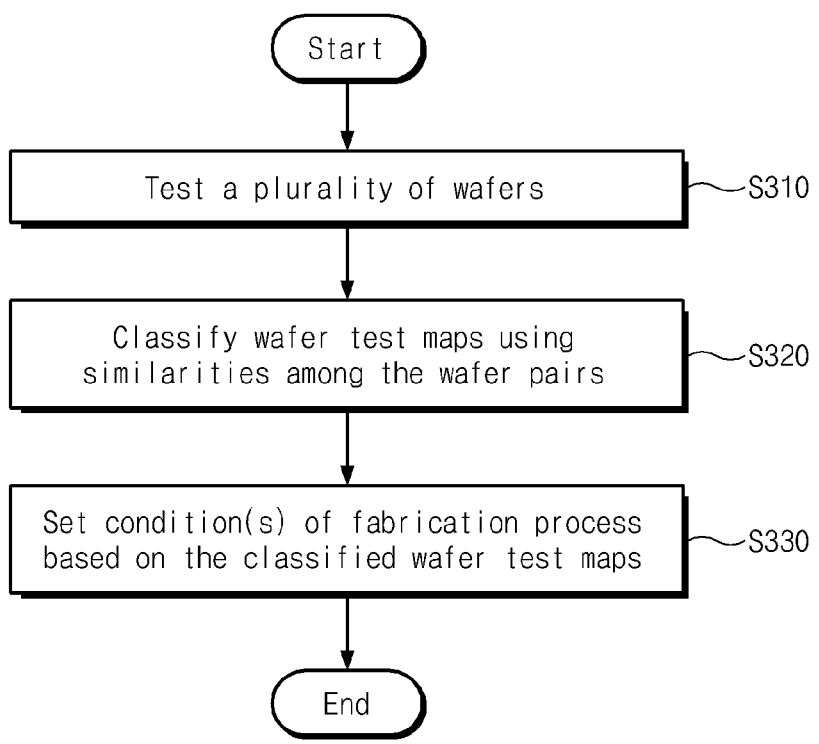
FIG. 17 is a flowchart illustrating a fabrication process condition setting method according to an embodiment.

FIG. 17 is a flowchart illustrating a fabrication process condition setting method according to an embodiment. The fabrication process condition setting method is now described with reference to FIG. 17. A plurality of wafers fabricated under at least one process condition are tested (S310). A test map corresponding to data on whether there is a predetermined failure for classification derives from a result of the test, and wafer test maps are classified using similarities of wafer pairs from the deriving test map (S320). The wafer test maps may be classified using the test map classification methods described with reference to FIGS. 4 and 16. Based on the classified wafer maps, a cause of process failure occurrence is investigated and the fabrication process condition is (re)set (S330).

The fabrication process condition setting method according to an embodiment is performed based on data of wafer maps automatically classified using similarities of wafer pairs.

In FIGS. 1 to 17, it is assumed that the test map classification method is performed to classify a test map of a wafer. However, embodiments are not limited thereto. The test map classification method according to embodiments may be a test map classification method of a display device panel (e.g., LCD panel).

According to embodiments, a test map is classified through an absolute classification criterion to improve a related art method using a neural network. As a result, four main effects may be expected, as set forth below.

First, a step of inputting a large amount of training data required to train a neural network may be omitted to overcome the disadvantage that a classification result relatively varies with the neural network training data, eliminate a limitation condition that all failure patterns are included in the neural network training data during classification through the neural network, and make it unnecessary to specify the total number of irregular patterns that are necessarily designated during use of an SOFM neural network. Since embodiments include a step of binding individual products to each other based on a similar relationship passing a determination criterion, there is no need for consideration of their total number.

Second, steps of signal enhancement and noise removal for use in a related art neural network are not required. In the related art neural network, when there are two test results (failed and good) on the same coordinate of two different products, they may be a penalty in similarity calculation, as compared to the same result between the two products. Thus, if the steps of signal enhancement and noise removal are performed, parts to be subjected to penalty for a similarity value disappear. For this reason, the capability of classifying test map patterns is reduced.

However, since the algorithm of embodiments are characterized in that similarity indexes (P1, P2, and P3) are different according to failure or non-failure on each coordinate, the steps of signal enhancement and noise removal are not required. Thus, the calculation step is significantly simplified, as compared to a related art classification method using a neural network. Accordingly, classification time is significantly reduced.

Third, spatial patterns may be classified irrespective of the kind of product in case of test maps having the same coordinate band. In embodiments, a determination reference value function (reference surface) based on the similarity indexes (P1, P2, and P3) and failure average and difference between products is searched. However, in test maps of all the products, a failure rate ranges from zero to 100 percent and an absolute determination reference for a similarity point per coordinate according to the failure rate average and difference is searched. Thus, embodiments may be applied to any kind of products and may automatically classify failure patterns having the same coordinate band.

Fourth, as soon as the test for products is completed, failure patterns are automatically classified to directly find a cause of failure through facility fabrication progress history and external and internal data link of a fabrication facility. Since the related art automatic test map classification through a neural network has an accuracy low enough to be applied to a practical field, failures of the same pattern are classified depending on a person's eyes. Thus, time required to find a cause of failure is delayed due to a person's inspection time required to identify the failures as soon as the test for products are completed, the facility fabrication progress history according to a result of the classification, and time required to collect internal and external data of the fabrication facility.

Meanwhile, if test map patterns of a product are accurately classified according to embodiments, an automated system directly collects facility fabrication progress history and external and internal data of the fabrication facility and statistically processes these data to find a cause of failure and shorten the time required to find the cause of failure.

Due to the shortened time required to find the failure cause that may start from the test for products, damage arising from the same failure may be prevented and an action to prevent reoccurrence of the damage is taken to significantly improve the quality of fabricated products.

According to the test map classification method and the fabrication process condition setting method using the same described so far, a step of inputting a large amount of training data can be omitted, as compared to related art classification methods using a neural network. In addition, a calculation procedure is much simpler and classification time is much shorter than the related art classification methods using a neural network. In addition, the classification method and the setting method can be applied to any kind of products and can automatically classify failure patterns having the same coordinate band. In addition, as soon as the test for products is completed, failure patterns are automatically classified to directly find a cause of failure through facility fabrication progress history and external and internal data link of a fabrication facility. In addition, the cause of failure is directly found to prevent damage arising from the same failure and take an action to prevent reoccurrence of the damage. As a result, the quality of fabricated products can be improved.

While embodiments have been particularly shown and described with reference to exemplary embodiments thereof, it will be apparent to those of ordinary skill in the art that various changes in form and detail may be made therein without departing from the spirit and scope of embodiments as defined by the following claims.

What is claimed is:

1. A test map classification method comprising:
at least one processor which executes:
modifying test data by converting the test data to a test map including a wafer identifier, a coordinate, and data on whether a predetermined failure item occurs;
calculating similarities of wafer pairs in the test map;
performing similarity filtering to reset all the similarities, except for at least one similarity, on the basis of a predetermined wafer;
determining whether there are similar wafers by comparing the filtered similarities with a reference value; and
classifying spatial patterns using a similar relationship between the wafer pairs when there are similar wafers,
wherein the calculating similarities of wafer pairs comprises:
calculating the similarities using similarity indexes corresponding to predetermined coordinates of the wafer pairs, the similarity indexes being values that depend on whether chips corresponding to the predetermined coordinates are failed or good, and
wherein the test map comprises a first wafer test map and a second wafer test map, classified by the wafer identifier, and
wherein the similarity indexes comprises a first similarity index that indicates when both chips corresponding to any one coordinate in the first and second wafer test maps are good, a second similarity index that indicates when one chip corresponding to any one coordinate in the first and second wafer test maps is good and the other chip is failed, and a third similarity index that indicates when both chips corresponding to any one coordinate in the first and second wafer test maps are failed.

2. The test map classification method of claim 1, wherein the predetermined coordinates are all coordinates.

3. The test map classification method of claim 1, wherein the predetermined coordinates are some coordinates.

4. The test map classification method of claim 1, wherein the third similarity index is greater than the first similarity index, and the first similarity index is greater than the second similarity index.

5. The test map classification method of claim 1, wherein each of the similarity indexes is the sum of similarity indexes of a corresponding wafer pair.

6. The test map classification method of claim 1, wherein each of the similarity indexes is an average of similarity indexes of a corresponding wafer pair.

7. The test map classification method of claim 1, wherein the performing similarity filtering further comprises:
selecting a similarity of a wafer pair according to a predetermined criterion when at least one wafer pair, of all wafer pairs, having a same similarity is selected.

8. The test map classification method of claim 1, wherein the reference value is dependent on averages of the wafer pairs when determining whether there are similar wafers.

9. The test map classification method of claim 8, wherein the reference value is dependent on a difference between failure rates of the wafer pairs.

10. The test map classification method of claim 9, wherein the determining whether there are similar wafers further comprises:
determining that there is a reference surface formed by the reference value, a relationship with averages of the failure rates, and a relationship with the differences between the failure rates, and that a pair of wafers existing within or above the reference surface are similar to each other.

11. A fabrication process condition setting method comprising:
testing wafers fabricated under at least one process condition;
classifying wafer test maps of the test wafers using a similarity; and
setting the at least one process condition using the classified wafer test maps,
wherein the similarity is calculated using similarity indexes that depend on whether chips corresponding to predetermined coordinates of a wafer pair are each failed or good, wherein the classifying wafer test maps comprises calculating similarities of all wafer pairs in the wafers, performing similarity filtering to reset all the calculated similarities, except for at least one similarity, on the basis of a predetermined wafer, determining whether there are similar wafers by comparing the filtered similarities with a reference value, and classifying spatial patterns using a similar relationship of a pair of wafers when the pair of wafers are similar to each other, wherein the wafer test maps comprise a first wafer test map and a second wafer test map, classified by the at least one process condition, and wherein the similarity indexes comprises a first similarity index that indicates when both chips corresponding to any one coordinate in the first and second wafer test maps are good, a second similarity index that indicates when one chip corresponding to any one coordinate in the first and second wafer test maps is good and the other chip is failed, and a third similarity index that indicates when both chips corresponding to any one coordinate in the first and second wafer test maps are failed.

12. A fabrication process condition setting method comprising:

testing a plurality of wafers fabricated under at least one process condition;

deriving a test map corresponding to data on whether there is a predetermined failure for classification;

classifying wafer test maps using similarities of wafer pairs from the deriving a test map; and setting the at least one process condition based on the classified wafer test maps, wherein the classifying wafer test map comprises calculating the similarities of all wafer pairs in the wafers, performing similarity filtering to reset all the calculated similarities, except for at least one similarity, on the basis of a predetermined wafer, determining whether there are similar wafers by comparing the filtered similarities with a reference value, and classifying spatial patterns using a similar relationship of a pair of wafers when the pair of wafers are similar to each other, wherein the calculating similarities of wafer pairs comprises:

calculating the similarities using similarity indexes corresponding to predetermined coordinates of the wafer pairs, the similarity indexes being values that depend on whether chips corresponding to the predetermined coordinates are failed or good, and wherein the test map comprises a first wafer test map and a second wafer test map, classified by the data, and wherein the similarity indexes comprises a first similarity index that indicates when both chips corresponding to any one coordinate in the first and second wafer test maps are good, a second similarity index that indicates when one chip corresponding to any one coordinate in the first and second wafer test maps is good and the other chip is failed, and a third similarity index that indicates when both chips corresponding to any one coordinate in the first and second wafer test maps are failed.

* * * * *